(12) United States Patent
Ko et al.

(10) Patent No.: US 7,688,093 B2
(45) Date of Patent: Mar. 30, 2010

(54) SHARING CONVERSION BOARD FOR TESTING CHIPS

(75) Inventors: Hsuan-Chung Ko, Hsinchu (TW); Chen-Yang Hsieh, Hsinchu (TW)

(73) Assignee: King Yuan Electronics Co., Ltd., Hsinchu (TW)

( * ) Notice: Subject to any disclaimer, the term of this patent is extended or adjusted under 35 U.S.C. 154(b) by 55 days.

(21) Appl. No.: 12/153,728

(22) Filed: May 23, 2008

(65) Prior Publication Data

US 2009/0153162 A1 Jun. 18, 2009

(30) Foreign Application Priority Data

Dec. 14, 2007 (TW) .............................. 96148018 A

(51) Int. Cl.
*G01R 31/02* (2006.01)
(52) U.S. Cl. .................... 324/754; 324/755; 324/761
(58) Field of Classification Search .................... None
See application file for complete search history.

(56) References Cited

U.S. PATENT DOCUMENTS 5,705,932 A * 1/1998 Fredrickson ................ 324/754
5,751,151 A * 5/1998 Levy et al. .................. 324/537
7,319,340 B2 * 1/2008 Jeddeloh et al. ............. 324/763

* cited by examiner

*Primary Examiner*—Minh N Tang
(74) *Attorney, Agent, or Firm*—Bacon & Thomas, PLLC

(57) ABSTRACT

The invention relates to a device interface board for testing chips, which is cooperatively installed with one of a plurality of probe cards. Each of the plurality of probe cards is provided with a specified wiring area and a first public signal area, the specified wiring area being electrically connected with the first public signal area. The first public signal area of each of the plurality of probe cards is located in a same particular area, and the specified wiring area of each of the plurality of probe cards is electrically connected with a testing jig and is different depending on a different testing jig. The device interface board comprises a chip test area and a second public signal area, in which the chip test area is used to carry a chip under test and is electrically connected with the second public signal area, whereby, through electrical connection between the device interface board and the first public signal area of each of the plurality of probe cards, test signals are transferred between the testing jig and the chip under test, and testing of chips under test having the same model are accomplished between different testing jigs.

10 Claims, 4 Drawing Sheets

SHARING CONVERSION BOARD FOR TESTING CHIPS

BACKGROUND OF THE INVENTION

1. Field of the Invention

The invention relates to a shared board for signal interface, particularly to a device interface board for use in testing chips to share probes cards/load board with different models of testing jigs.

2. Background of the Invention

When a wafer testing factory is proceeding with testing a huge number of chips, allocation of the capacity of the testing jigs and internal factors of the factory will be taken into consideration. Therefore, in order to increase the production capacity of the factory and reduce idle of the testing jigs, devices of a tester A may be transferred to a testing jig B for cooperatively testing.

However, as chips under test with the same model are tested in different testing jigs, modifications respectively on hardware and software are needed so as to correspond to different specifications and arrangement of the different testing jigs, such as redesigning a load board and a probe card and modifying program used in a testing jig. Nevertheless, it takes much time during modifications and also needs some time for testing after modifications. It's cost lots of time and money. That's a disadvantage situation for both customers and the factory.

There is an urgent need to develop a conversion board capable of sharing different testing jigs of the factory such that it is unnecessary to redesign the software and hardware of the testing jigs and is capable of directly testing the chips under test.

BRIEF SUMMARY OF THE INVENTION

The invention relates to a device interface board for testing chips, which is cooperatively installed universal board. Each of the plurality of probe cards/load board is provided with a specified wiring area and a first public signal area, the specified wiring area being electrically connected with the first public signal area and the first public signal area of each of the plurality of probe cards being located in a same particular area. The specified wiring area of each of the plurality of probe cards is electrically connected with a testing jig and is different depending on a different testing jig. The device interface board comprises a chip test area and a second public signal area, in which the chip test area is used to carry a chip under test and is electrically connected with the second public signal area, whereby, through the electrical connection between the device interface board and the first public signal area of each of the plurality of probe cards, test signals are transferred between the one testing jig and the chip under test, and testing of chips to be tested with the same model are accomplished between different testing jigs.

Based on the above, the device interface board can be electrically connected not only to the public signal area of the probe card on a testing jig, but also to the public signal area of a different probe card on a different testing jig, thereby transferring test signals of a testing jig to a chip under test and further feedbacking output signals from the chip under test to the testing jig so as to accomplish the work of testing the chips to be tested with the same model among different testing jigs.

Meanwhile, the second public signal area of the device interface board corresponds to the first public signal area of one of the plurality of probe cards and both of the public signal areas include a power source signal block, a test input signal block and a test output block. The power source signal block is to deliver the power provided by the testing jig to the chip under test so as to provide the power required for testing chips. The power source signal block may be a DC source block.

The test input signal block may include a digital signal block and an arbitrary wave generator (AWG) block so as to provide test signals for testing chips under test. The test output block may include a digitizer block so as to sample output signals from the chips under test. The digital signal block may transfer the test signals provided by the testing jig to the chips under test for testing.

The arbitrary wave generator block is capable of transferring the test signals provided by the testing jig to the chips under test for testing. The digitizer block is capable of feedbacking the result of the test signals outputted by the chips under test to the testing jig. The device interface board may further comprise an RF signal plug including a connecting tip to electrically connect RF signal contacts of the device interface board in parallel so as to solve the problem of distortion of the RF signals during transmission.

The second public signal area of the device interface board may be a public signal area of a male connector and the first public signal area of each of the plurality of probe cards may be a public signal area of a female connector. Or, the second public signal area of the device interface board may be a public signal area of a female connector and the first public signal area of each of the plurality of probe cards may be a public signal area of a male connector.

DETAILED DESCRIPTION OF THE INVENTION

Figure 1:
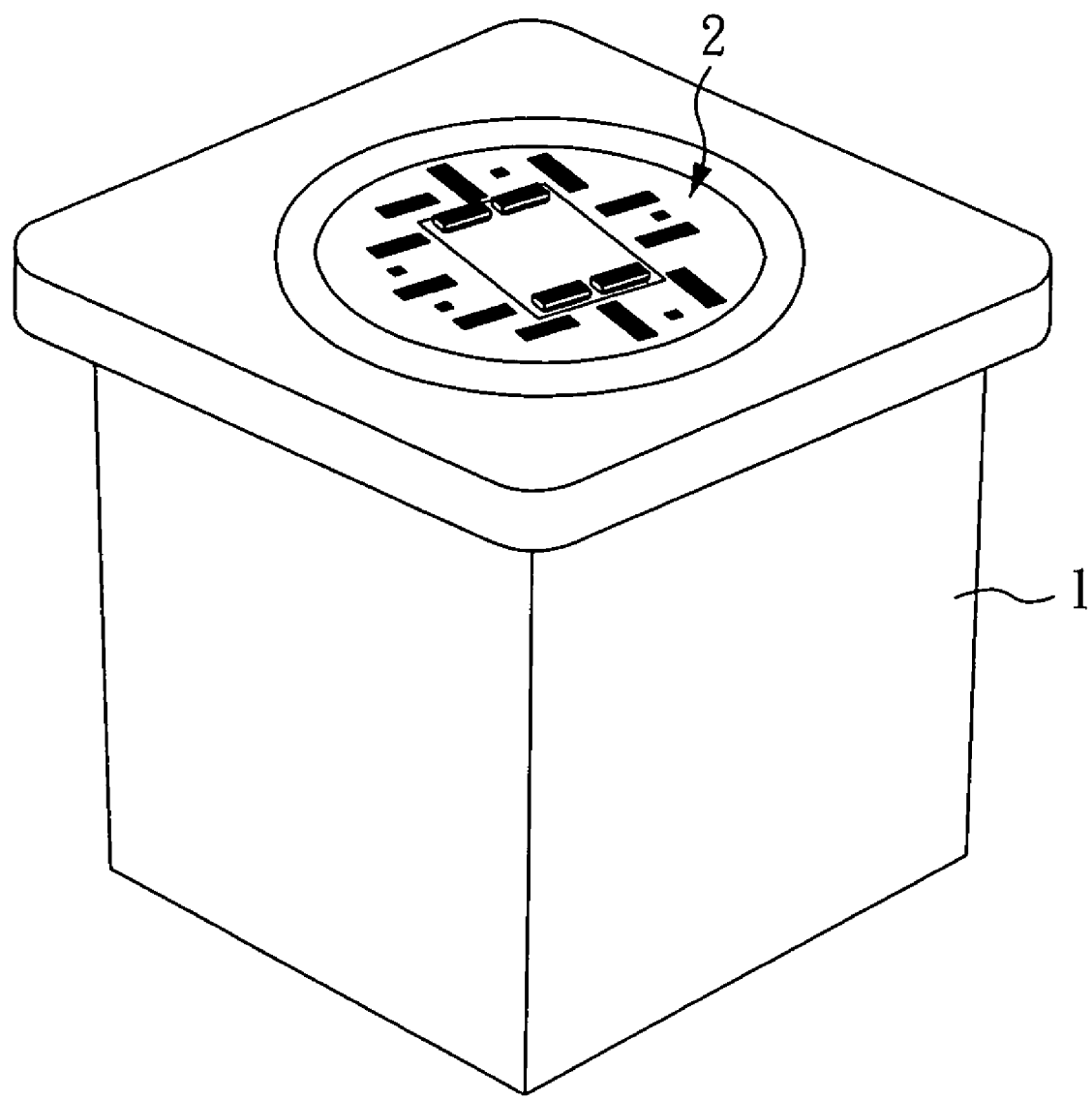
FIG. 1 is a three-dimensional diagram showing a first preferred embodiment of the present invention.
Figure 2:
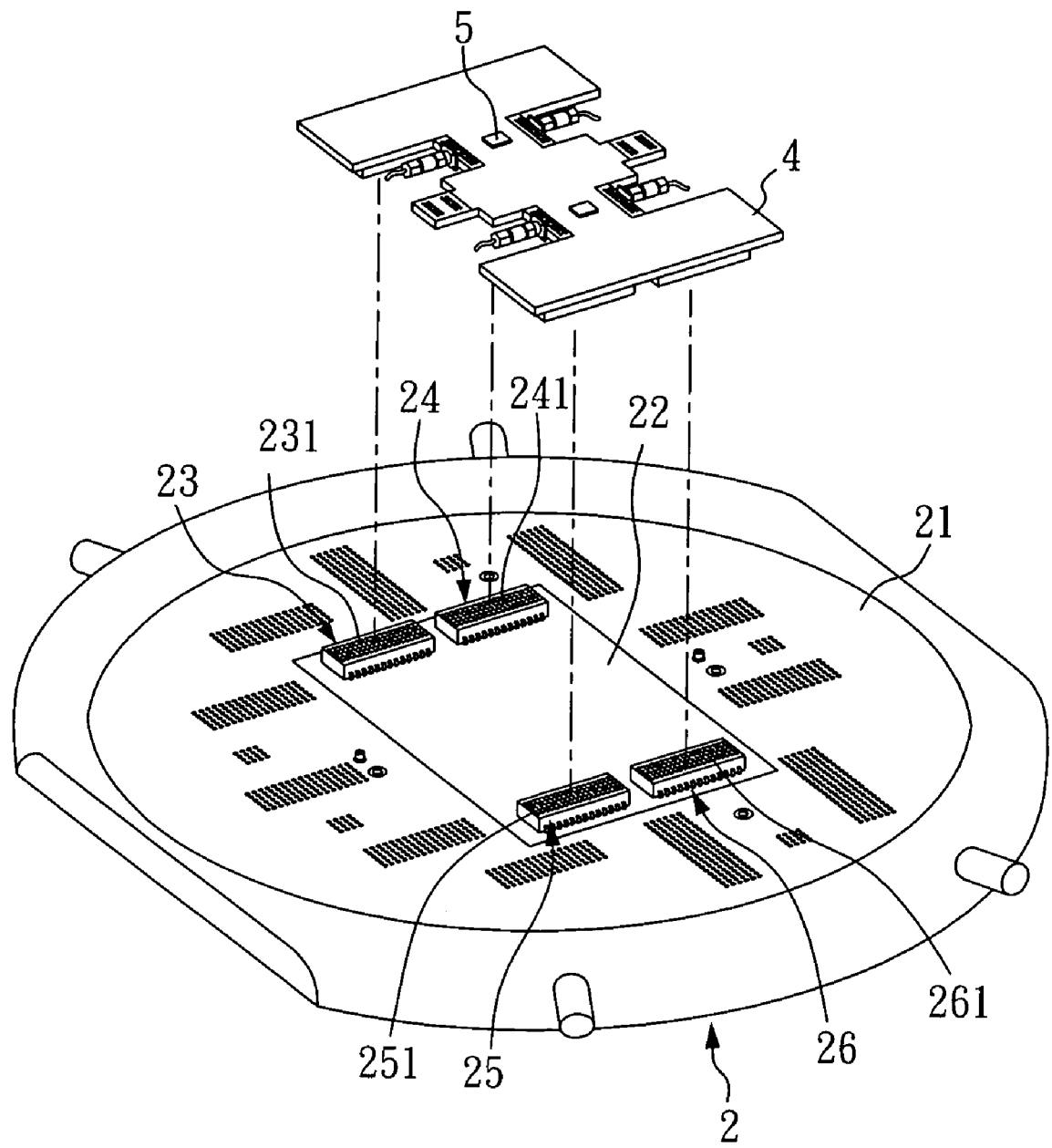
FIG. 2 is an exploded diagram showing a probe card and a device interface board of the first preferred embodiment of the invention.

Please refer to FIGS. 1 and 2. FIG. 1 is a three-dimensional diagram showing a first preferred embodiment of the present invention and FIG. 2 is an exploded diagram of the first preferred embodiment of the invention.

As shown in FIGS. 1 and 2, the invention relates to a device interface board for testing chips, which is cooperatively installed with a probe card 2 on a testing jig 1. The probe card 2 is provided with a specified wiring area 21 and a first public signal area 22, the specified wiring area 21 being electrically connected with the first public signal area 22 and the first public signal area 22 being installed in the center portion of the probe card 2. The specified wiring area 21 of the probe card 2 is electrically connected with the testing jig 1.

Figure 3:
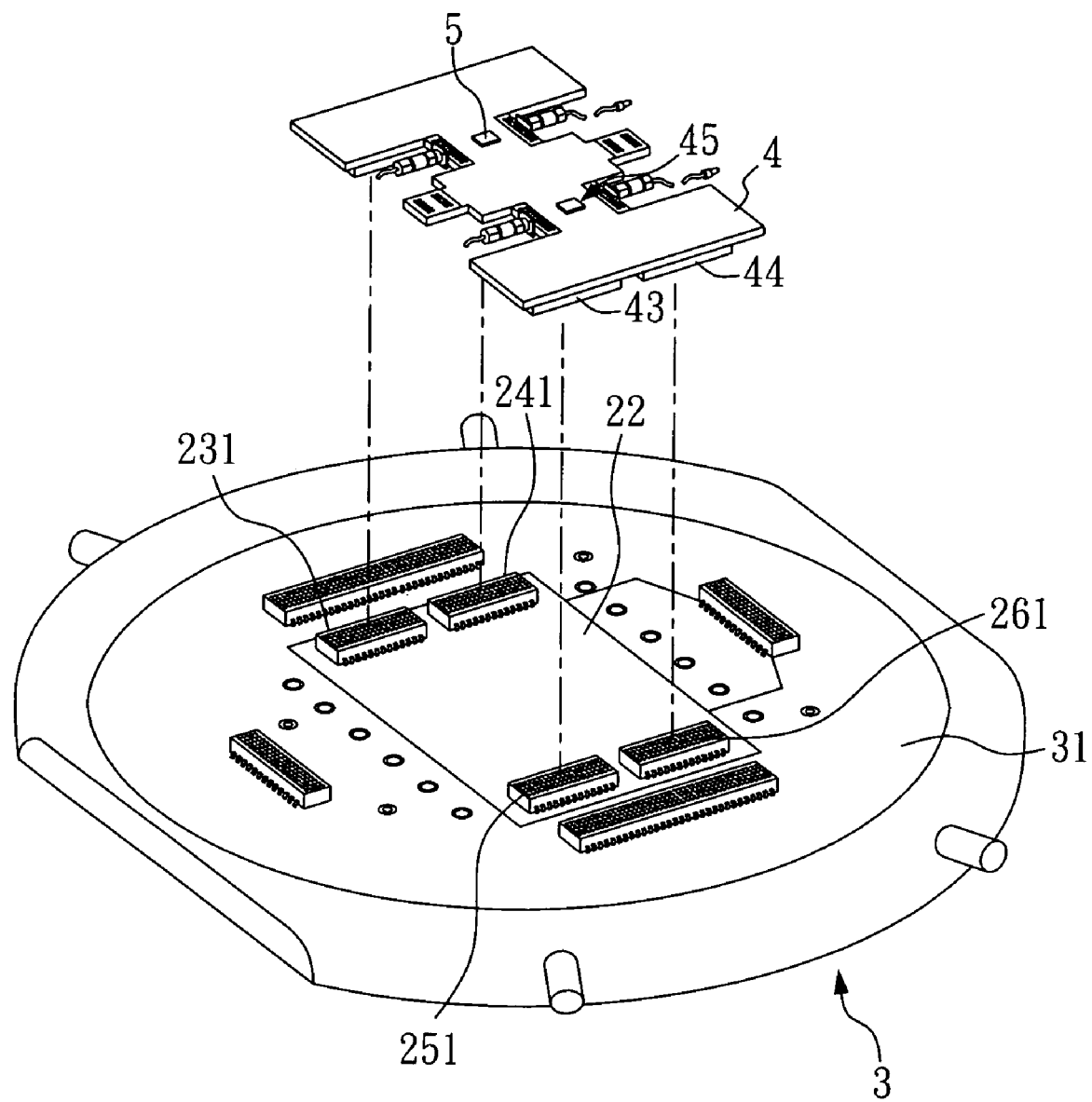
FIG. 3 is an exploded diagram showing a second preferred embodiment of the invention, using a probe card different from that used in the first preferred embodiment.

Please refer to FIG. 3, which is an exploded diagram showing a second preferred embodiment of the invention, including a device interface board 4 and a probe card 3 different from that used in the first preferred embodiment of the invention. The probe card 3 is substantially the same as the probe card 2 in structure except for a specified wiring area 31. Since the probe card 3 is electrically connected to another testing jig, the specified wiring area 31 is wired in layout to meet the specification of another testing jig. However, the first public signal area 22 of the probe card 3 is installed in the same manner as the first public signal area 22 of the probe card 2.

Figure 4:
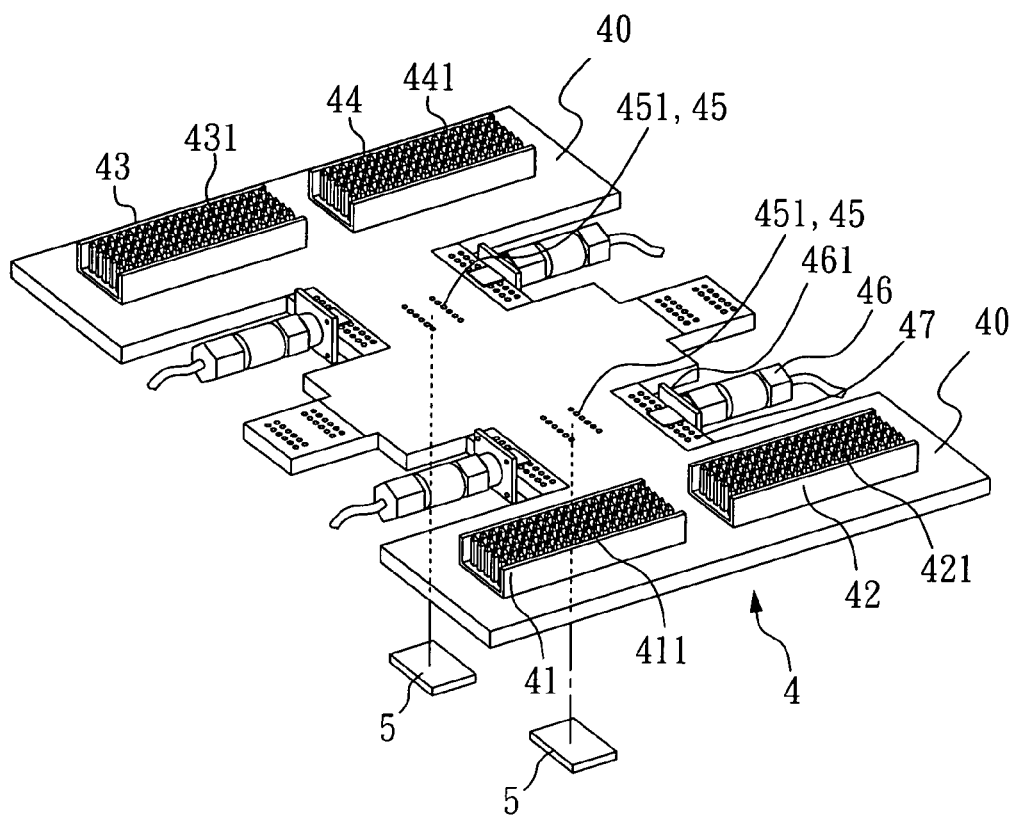
FIG. 4 is a three-dimensional diagram showing an inverted device interface board of the invention.

Please refer to FIG. 4 accompanying with FIGS. 2 and 3. FIG. 4 is a three-dimensional diagram showing an inverted device interface board of the invention. As illustrated in the drawings, the device interface board 4 comprises a second public signal area 40 and a chip test area 45, in which the chip test area 45 includes two sets of test pins 451.

The second public signal area 40 of the device interface board 4 corresponds to the first public signal area 22 of the probe card 2 and to the public signal area 22 of the probe card 3 and the public signal areas respectively include a power source signal block 25 or 43, test input signal blocks 23 and 24 or 41 and 42, and a test output block 26 or 44.

The power source signal blocks 25 and 43 are to deliver the power provided by the testing jig 1 to a chip 5 under test so as to provide the power required for testing the chip 5 under test. In the preferred embodiment, the power source signal blocks 25 and 43 are respectively DC source blocks 251 and 431. The test input signal blocks 23, 24, 41 and 42 respectively include a digital signal block 231 or 411, and an arbitrary wave generator (AWG) block 241 or 421. The test output blocks 26 and 44 respectively include digitizer blocks 261 and 441 so as to sample output signals from the chip 5 under test.

The digital signal blocks 231 and 411 are to transfer the test signals provided by the testing jig 1 to the chip 5 under test for testing. The arbitrary wave generator block 41 and 421 are to transfer the analogue test signals provided by the testing jig 1 to the chip 5 under test for testing. The digitizer blocks 261 and 441 are to feedback the result of the test signals outputted by the chip 5 under test to the testing jig.

The chip test area 45 of the device interface board 4 is used to carry the chip 5 under test. In the embodiment, each of two chips 5 under test are respectively inserted into the two sets of test pins 451 for testing. He chip test area 45 is electrically connected to the second public signal area 40. Through the electrical connection between the second public signal area 40 of the device interface board 4 and the first public signal area 22 of the probe card 2 or 3, test signals from different testing jigs are transferred to the chips 5 under test via the device interface board 4 and measured signals of the chips 5 under test are fed back to the testing jig.

As shown in FIG. 4, the surrounding of the device interface board 4 provides four RF signal plugs 46. In the embodiment, each RF signal plug 46 includes a connecting tip 461 to electrically connect RF signal contacts 47 of the device interface board 4 in parallel, which is different from the conventional way of proceeding with the connection in a vertical manner. Therefore, the invention is capable of solving the problem encountered in the prior art, in which the RF signals are discontinuous due to vertical bending of the contacts, thereby eliminating distortion of the RF signals during transmission.

Figure 5:
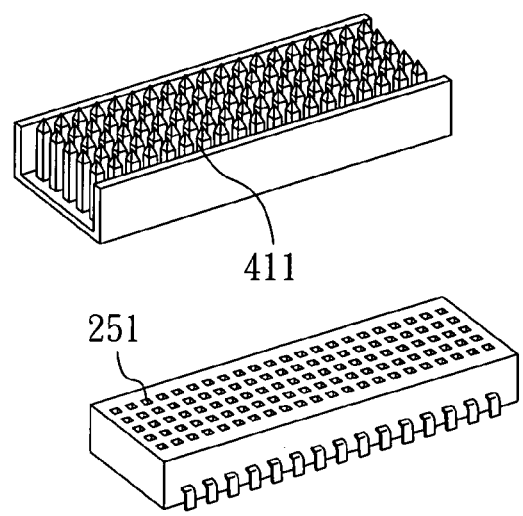
FIG. 5 is a three-dimensional diagram showing a male connector used in the invention.

Please refer to FIG. 5, which is a three-dimensional diagram showing a male connector used in the invention. In the embodiment, the second public signal area 40 of the device interface board 4 uses a standard male connector. As shown in FIG. 5, the first public signal area 22 respectively of the probe cards 2 and 3 uses a standard female connector. Using such connectors, in addition to facilitating the planning of the wiring between the public signal area of the device interface board and the public signal area of the probe card 2 or 3, it is also convenient for assembling and disassembling of the probe card 2 or 3 and the device interface board 4.

It can be seen from the above example that the device interface board 4 can be electrically connected not only to the first public signal area 22 of the probe card 2, but also to the first public signal area 22 of the probe card 3, thereby transferring the test signals from the testing jig to the chips 5 under test and feedback the output signals from the chips 5 under test to the testing jig so as to accomplish the testing of the chips under test with the same model among different testing jigs.

The above embodiments are merely proposed for the convenience of interpretation. What is claimed in the invention should be based on what is described in the claims, but not be limited to the embodiments disclosed above.

We claim:

1. A device interface board for testing chips, cooperatively installed with one of a plurality of probe cards, each of said plurality of probe cards being provided with a specified wiring area and a first public signal area, said specified wiring area being electrically connected with said first public signal area, said first public signal area of each of said plurality of probe cards being located in a same particular area, and said specified wiring area of each of said plurality of probe cards being electrically connected with a testing jig and being different depending on a different testing jig; said device interface board comprises:

a chip test area and a second public signal area, in which said chip test area is used to carry a chip under test and is electrically connected with said second public signal area, whereby, through electrical connection between the device interface board and said first public signal area of each of said plurality of probe cards, test signals of said testing jig are transferred to said chip under test and measured signals of said chip under test are fed back to said testing jig;

wherein said second public signal area of said device interface board corresponds to said first signal public area of each of said plurality of probe cards, and said device interface board and each of said plurality of probe cards respectively include a power source signal block, a test input signal block and a test output block, and said test input signal block includes at least one of a digital signal block and an arbitrary wave generator block, so as to output test signals to the chip under test for testing.

2. A device interface board for testing chips as claimed in claim 1, wherein said power source signal block is to deliver power provided by said test jig to said chip under test, thereby providing the power required by the chip under test, and said power signal source block is a DC source block.

3. A device interface board for testing chips as claimed in claim 1, wherein said test output block includes a digitizer block to sample output signals of said chip under test.

4. A device interface board for testing chips as claimed in claim 3, wherein said digitizer block is to feedback the result of the test signals outputted by said chip under test to said testing jig.

5. A device interface board for testing chips as claimed in claim 1, wherein said digital signal block transfers the test signals provided by said testing jig to said chip under test for testing.

6. A device interface board for testing chips as claimed in claim 1, wherein said arbitrary wave generator block transfers the test signals provided by said testing jig to said chip under test for testing.

7. A device interface board for testing chips as claimed in claim 1, wherein said second public signal area of said device interface board is a public signal area of a male connector and said first public signal area of said each probe card is a public signal area of a female connector.

8. A device interface board for testing chips as claimed in claim 1, wherein said second public signal area of said device interface area is a public signal area of a female connector and said first public signal area of said each probe card is a public signal area of a male connector.

9. A device interface board for testing chips as claimed in claim 1, wherein said chip test area includes a plurality of sets of testing pins for testing chips when inserting the chip under test into the plurality of sets of testing pins.

10. A device interface board for testing chips as claimed in claim 1, further comprising a radio frequency (RF) signal plug, including a connecting tip to electrically connect to at least one of radio frequency signal contacts of said device interface board in parallel.

* * * * *